United States Patent [19]

Suda

[11] Patent Number: 4,897,363

[45] Date of Patent: Jan. 30, 1990

[54] METHOD OF MANUFACTURING SEMICONDUCTOR DEVICE ISOLATION

[75] Inventor: Kakutaro Suda, Itami, Japan

[73] Assignee: Mitsubishi Denki Kabushiki Kaisha, Tokyo, Japan

[21] Appl. No.: 342,086

[22] Filed: Apr. 24, 1989

Related U.S. Application Data

[62] Division of Ser. No. 100,947, Sep. 25, 1987, Pat. No. 4,840,920.

[30] Foreign Application Priority Data

Jul. 2, 1987 [JP]  Japan .................................. 62-167182

[51] Int. Cl.[4] .................... H01L 21/76; H01L 21/302
[52] U.S. Cl. ........................ 437/63; 437/70; 437/72
[58] Field of Search ............ 437/33, 63, 67, 69, 437/70, 72, 75

[56] References Cited

U.S. PATENT DOCUMENTS

| | | | |
|---|---|---|---|
| 4,381,956 | 5/1983 | Lane | 437/67 |
| 4,434,543 | 3/1984 | Schwabe et al. | 437/70 |
| 4,694,562 | 9/1987 | Iwasaki et al. | 437/57 |

Primary Examiner—Olik Chaudhuri
Attorney, Agent, or Firm—Oblon, Spivak, McClelland, Maier & Neustadt

[57] ABSTRACT

In a method of manufacturing a semiconductor device according to the present invention, regions of first conductivity type buried layers formed on a first conductivity type substrate are retracted with respect to regions of second conductivity type buried layers. Thus, in formation of second conductivity type epitaxial layer, first conductivity type impurity contained in the first conductivity type buried layers is prevented from floating diffusion up to element regions of the second conductivity type epitaxial layers. At the same time, the semiconductor device can be implemented with high density of integration.

1 Claim, 11 Drawing Sheets

METHOD OF MANUFACTURING SEMICONDUCTOR DEVICE ISOLATION

This is a division of application Ser. No. 100,947 filed on Sept. 25, 1987, now U.S. Pat. No. 4,840,920.

BACKGROUND OF THE INVENTION

1. Field of the Invention

The present invention relates to a method of manufacturing a semiconductor device, and more particularly, it relates to technique of isolating adjacent element regions by isolation regions.

2. Description of the Prior Art

FIGS. 2A to 2G are sectional views showing principal manufacturing steps for forming element regions and isolation regions by a conventional oxide film isolation method. With reference to FIGS. 2A to 2G, description is now made on the conventional method.

First, as shown in FIG. 2A, a nitride film 201 and an oxide film 101 having a thickness of about 100 nm are successively stacked on a $p^-$-type semiconductor substrate 1 of low impurity concentration. Resist films 301 are formed in regions substantially corresponding to isolation regions on the nitride film 201 to perform etching by utilizing the resist films 301 as masks, thereby to leave two-layer films only on predetermined regions of the $p^-$-type semiconductor substrate 1 as shown in FIG. 2B. Symbol X denotes first regions in which the two-layer films of the oxide film 101 and the nitride film 201 are left and symbol Y denotes second regions from which the oxide and nitride films 101 and 201 are removed. A plurality of such second regions Y are defined to be surrounded by the first regions X.

Then the two-layer films of the oxide film 101 and the nitride film 201 are utilized as masks to introduce n-type impurity such as arsenic into the second regions Y of the semiconductor substrate 1 through ion implantation or the like, thereby to form $n^+$-type impurity implantation layers 21 as shown in FIG. 2B.

Thereafter the nitride films 201 are utilized as masks to perform selective oxidation, thereby to form oxide films 102 of several hundred nm in thickness on the second regions Y of the semiconductor substrate 1. The oxide films 102 are preferably three to ten times the thickness of the oxide films 101. Then, heat treatment is performed to diffuse the n-type impurity contained in the $n^+$-type impurity implantation layers 21, thereby to form $n^+$-type buried layers 22 of high impurity concentration as shown in FIG. 2C.

Then the nitride films 201 are removed by etching and the oxide films 102 are utilized as masks to introduce p-type impurity such as boron into the first regions X of the semiconductor substrate 1 through the oxide films 101 by ion implantation or the like. Thereafter heat treatment is performed to diffuse the p-type impurity, thereby to form $p^+$-type buried layers 3 of high impurity concentration between adjacent pairs of the $n^+$-type buried layers 22 as shown in FIG. 2D.

The oxide films 101 and 102 are removed by wet etching through hydrofluoric acid (HF), to form $n^-$-type epitaxial layer 4 of low impurity concentration containing n-type impurity such as arsenic on the semiconductor substrate 1 provided on its surface part with the $n^+$-type buried layers 22 and the $p^+$-type buried layers 3, as shown in FIG. 2E.

A nitride film 202 and an oxide film 103 having a thickness of about several ten nm are successively stacked on the surface of the $n^-$-type epitaxial layer 4, to form resist films 302 in regions corresponding to element regions on the nitride film 202. Then the resist films 302 are utilized as masks to remove a two-layer film of the oxide film 103 and the nitride film 202 by etching, thereby to leave the two-layer films only in the regions corresponding to the element regions. Then, three-layer films of the oxide films 103, the nitride films 202 and the resist films 302 left as shown in FIG. 2F are utilized as masks to etch regions of the epitaxial layer 4 corresponding to isolation regions to prescribed depth.

Then the resist films 302 are removed and selective oxidation is performed by utilizing the nitride films 202 as masks, thereby to form thick oxide films 104 in regions corrsponding to the isolation regions as shown in FIG. 2G. The oxide films 104 are formed to be partially in contact with the $n^+$-type buried layers 22 in the bottom sides thereof as shown in FIG. 2G. Finally the nitride films 202 and the oxide films 103 are removed.

In the conventional method of manufacturing a semiconductor device through the oxide film isolation method, the regions for introducing the p-type impurity into the $p^-$-type semiconductor substrate 1 (regions corresponding to the oxide films 101 of the $p^-$-type semiconductor substrate 1 in FIG. 2C) are determined by the oxide films 102 formed on the regions in which the n-type impurity has been introduced into the $p^-$-type semiconductor substrate 1 in the preceding step (regions corresponding to the $n^+$-type impurity implantation layers 21 in FIG. 2B), whereby edges of the regions introduced with p-type impurity and those introduced with the n-type impurity are substantially at the same positions.

Therefore, when extreme floating diffusion of the $p^+$-type impurity takes place in formation of the $n^-$-type epitaxial layer 4 after formation of the $p^+$-type buried layers 3 and the $n^+$-type buried layers 22, p-type regions 33 are partially left in the $n^-$-type epitaxial layers 4 serving as the element regions in a later step of forming the oxide films 104 for isolation, as shown in FIG. 2G.

When the p-type regions 33 are thus partially left in the $n^-$-type epitaxial layers 4, a plurality of p-type diffusion layers to be formed in the $n^-$-type epitaxial layers 4 in a later step are brought into contact with the p-type regions 33, to be electrically coupled with each other through the p-type regions 33.

The isolation regions may be expanded in consideration of the residual p-type regions 33, whereas such expansion of the isolation regions prevents implementation of the semiconductor device with high density of integration.

The aforementioned problem is also caused when the p-type and n-type polarities are inverted in the manufacturing steps as shown in FIGS. 2A to 2G.

SUMMARY OF THE INVENTION

The present invention is directed to a method of manufacturing a semiconductor device by isolating adjacent ones of element regions by isolation regions.

The method of manufacturing a semiconductor device according to the present invention comprises: a first step of successively stacking a first oxide film and a first nitride film on a first conductivity type semiconductor substrate of low impurity concentration; a second step of removing a plurality of portions of a two-layer film formed by the first oxide film and the first nitride film through etching to form first regions in which the two-layer films are left and second regions surrounded by the first regions; a third step of introducing second conductivity type impurity into the second regions of the semiconductor substrate by utilizing the two-layer films of the first regions as masks; a fourth step of performing side etching of side walls of the first oxide films by utilizing the first nitride films as masks to retract edges of the first oxide films to prescribed positions in the first regions; a fifth step of perfoming selective oxidation by utilizing the first nitride films as masks to form second oxide films being larger in thickness than the first oxide films on the second regions of the semiconductor substrate and on regions exposed in the fourth step within the first regions of the semiconductor substrate; a sixth step of diffusing the second conductivity type impurity introduced into the second regions of the semiconductor substrate in the third step by heat treatment to form second conductivity type buried layers of high impurity concentration; a seventh step of introducing, after removing the first nitride films, first conductivity type impurity into only regions having surfaces covered by the first oxide films within the first regions of the semiconductor substrate through the first oxide films by utilizing the second oxide films as masks and performing heat treatment to form first conductivity type buried layers of high impurity concentration in regions between adjacent ones of the second conductivity type buried layers; and an eighth step of removing the first oxide films and the second oxide films to form a second conductivity type epitaxial layer on the semiconductor substrate.

Accordingly, a principal object of the present invention is to provide a method of manufacturing a semiconductor device, which can prevent formation of reverse conductivity type regions in epitaxial layers serving as element regions while implementing the semiconductor device with higher density of integration.

According to the method of manufacturing a semiconductor device of the present invention, edges of regions for introducing second conductivity type impurity into a first conductivity type semiconductor substrate are determined by two-layer films of first oxide films and first nitride films formed in first regions. On the other hand, edges of regions for introducing first conductivity type impurity into the first conductivity type semiconductor substrate are determined by second oxide films formed over regions where edges of the first oxide films are retracted toward the first regions by side etching of the first oxide films through masks of the first nitride films and second regions. Thus, the edges of the regions for introducing the first conductivity type impurity into the first conductivity type semiconductor substrate are separated by prescribed distances from the edges of the regions introduced with the second conductivitiy type impurity in a preceding step, whereby no first conductivity type region is formed in second conductivity type epitaxial layers serving as element regions even if extreme floating diffusion of the first conductivity type impurity takes place in formation of the second conductivity type epitaxial layers.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1A to 1H are sectional views showing manufacturing steps in an embodiment of the present invention, which is adapted to form element regions and isolation regions by an oxide film isolation method. With reference to FIGS. 1A to 1H, description is now made on the embodiment of the present invention.

Figure 1A:
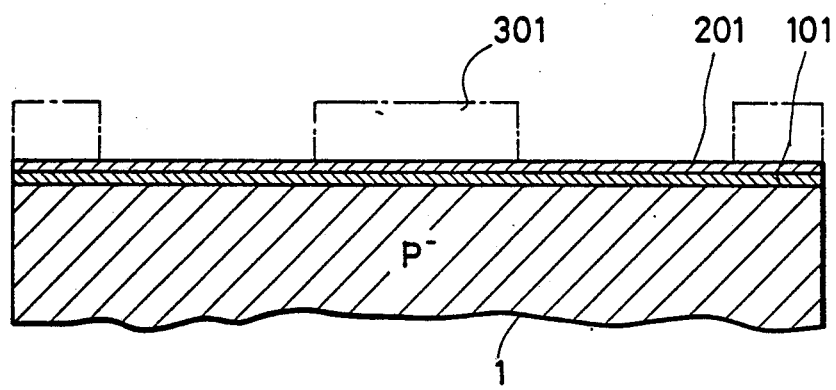
FIGS. 1A to 1H are sectional views showing principal steps of a method of manufacturing a semiconductor device according to an embodiment of the present invention.
Figure 1B:
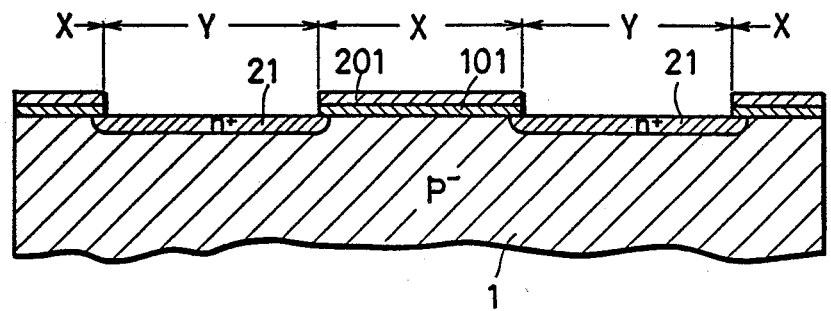

First, as shown in FIG. 1A, a nitride film 201 and an oxide film 101 having a thickness of about 100 nm are successively stacked on a $p^-$-type semiconductor substrate 1 of low impurity concentration. Similarly to the conventional method, first regions X in which the two-layer films are left and second regions Y from which the two-layer films are removed are formed. The two-layer films are utilized as masks to introduce second conductivity type impurity such as arsenic into the second regions Y of the semiconductor substrate 1 through ion implantation or the like, thereby to form $n^+$-type impurity implantation layers 21 as shown in FIG. 1B.

Figure 1C:
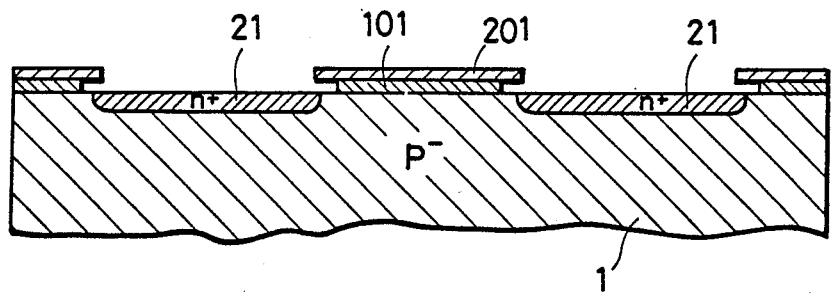

Then, side walls of the left oxide films 101 are etched by utilizing the left nitride films 201 as masks, to retract edges of the oxide films 101 to prescribed positions in the first regions X as shown in FIG. 1C.

Figure 1D:
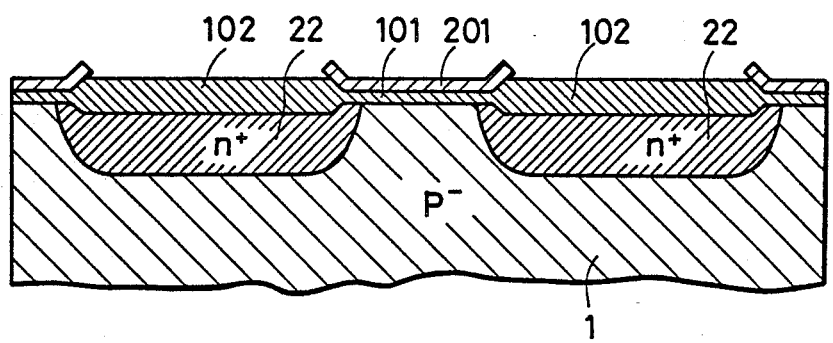

Thereafter the nitride films 201 are utilized as masks to perform selective oxidation, thereby to form oxide films 102 of several hundred nm in thickness on the second regions Y of the semiconductor substrate 1 and on parts of the first regions X of the semiconductor substrate 1 from which the oxide films 101 are removed by side etching, as shown in FIG. 1D.

Then, heat treatment is performed to diffuse n-type impurity contained in the $n^+$-type impurity implantation layers 21, thereby to form $n^+$-type buried layers 22 as shown in FIG. 1D. If the n-type impurity is prepared by antimony (Sb), for example, the oxide films 102 are formed by performing selective oxidation by utilizing the nitride films 201 as masks after formation of the $n^+$-type buried layers 22 through heat treatment.

The nitride films 201 are removed and the oxide films 102 are utilized as masks to introduce p-type impurity such as boron into only regions covered by the oxide films 101 on the semiconductor substrate 1 by ion implantation or the like through the oxide films 101. Edges of the regions introduced with the p-type impurity are separated from the boundaries between the first and second regions X and Y of the semiconductor substrate 1, i.e., the edge positions of the regions introduced with the n-type impurity by distances of retraction of the oxide films 101 through side etching. Such distances can be adjusted by controlling removal of the oxide films 101 through side etching.

Figure 1E:
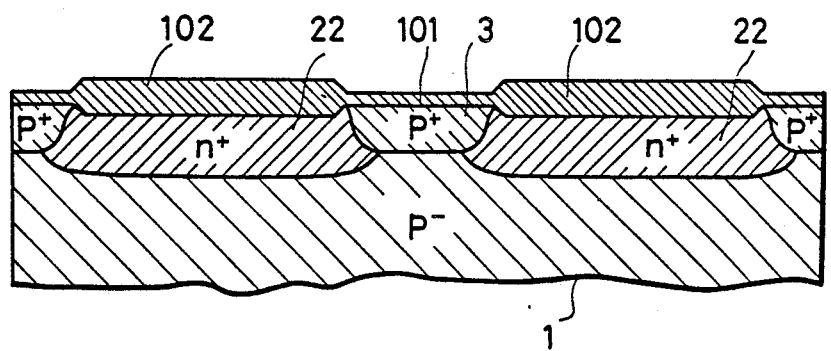

Further, heat treatment is performed to diffuse the p-type impurity, thereby to form p+-type buried layers 3 of high impurity concentration between adjacent ones of the n+-type buried layers 22 as shown in FIG. 1E.

Figure 1F:
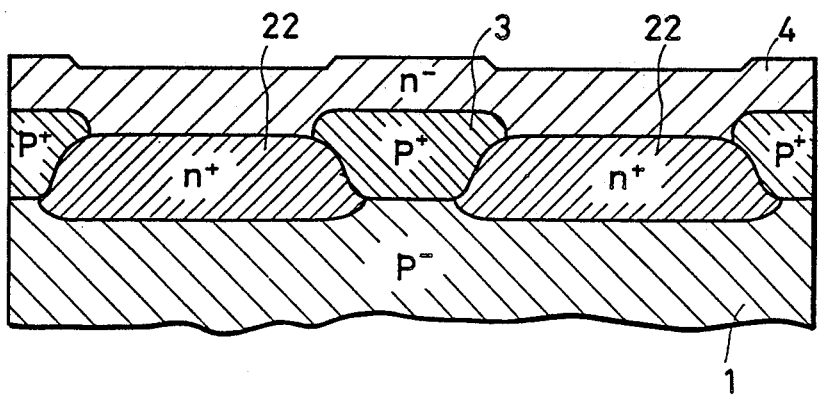

Thereafter the oxide films 101 and 102 are removed and n−-type epitaxial layer 4 of low impurity concentration are formed on the semiconductor substrate 1, which is provided on its surface part with the n+-type buried layers 22 and the p+-type buried layers 3 as shown in FIG. 1F. Even if floating diffusion of the p-type impurity contained in the p+-type buried layers 3 takes place, regions of the p+-type buried layers 3 after formation of the n−-type epitaxial layer 4 can be narrowed as compared with the conventional case since the regions of the p+-type buried layers 3 are retracted with respect to regions of the n+-type buried layers 22.

Figure 1G:
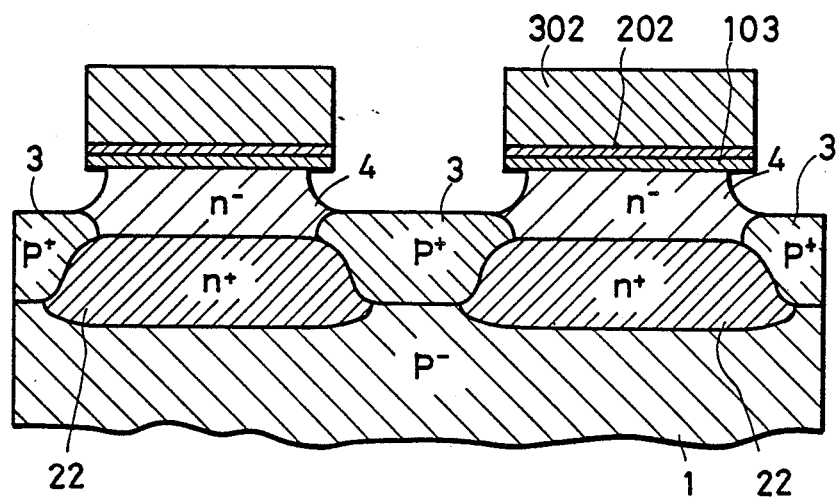

Thereafter three-layer films of the oxide films 103, the nitride films 202 and the resist films 302 are utilized as masks to etch regions of the n−-type epitaxial layer 4 corresponding to isolation regions to prescribed depth similarly to the conventional case, as shown in FIG. 1G. If necessary, p-type impurity such as boron is additionally introduced into the isolaiton regions by utilizing the three-layer films as masks through ion implantation or the like, to be activated by heat treatment. Such additional introduction of the p-type impurity is performed on the assumption that the p-type impurity is partially incorporated in the oxide films 104 in formation of oxide films 104 in a later step (see FIG. 1H), whereby impurity concentration of the p+-type buried layers 3 is changed.

Figure 1H:
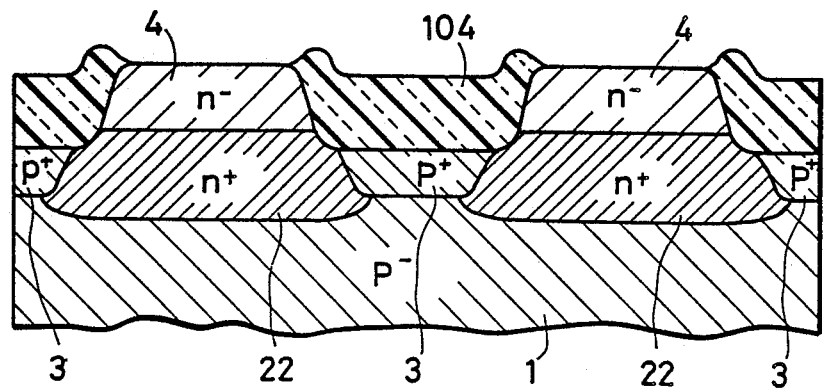
Figure 2A:
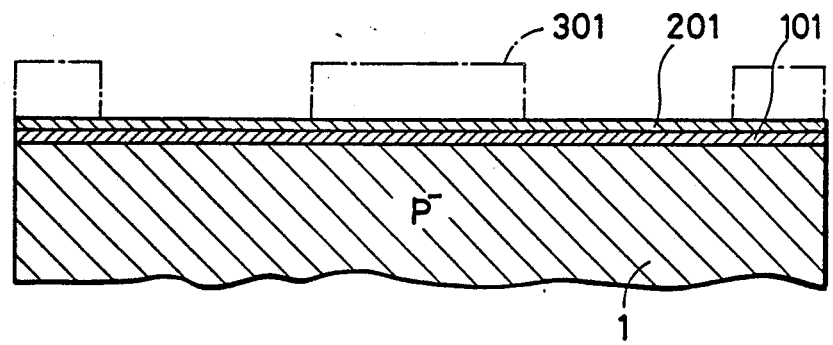
FIGS. 2A to 2G are sectional views showing principal steps of a conventional method of manufacturing a semiconductor device.
Figure 2B:
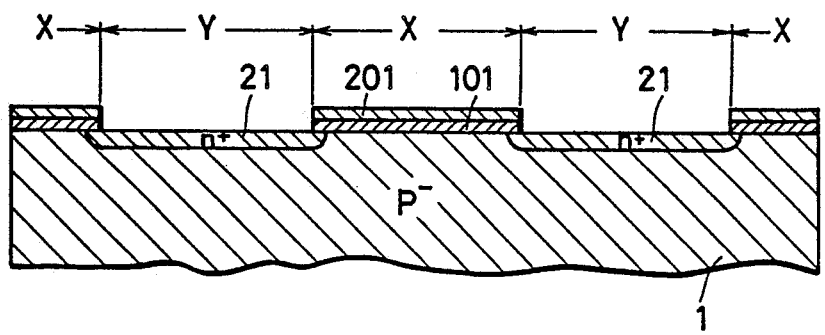
Figure 2C:
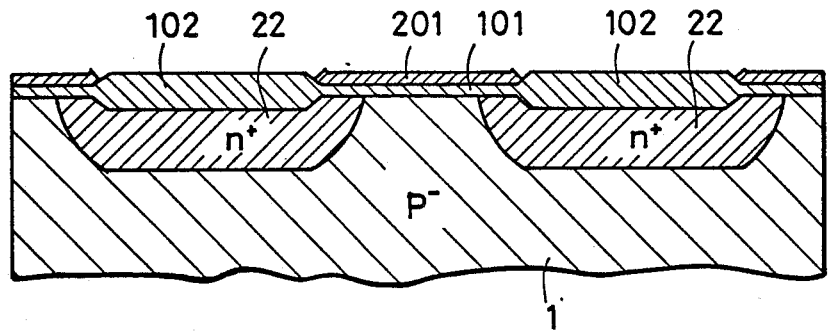
Figure 2D:
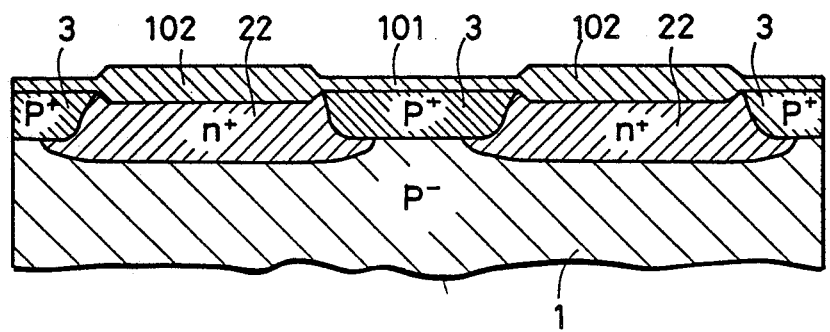
Figure 2E:
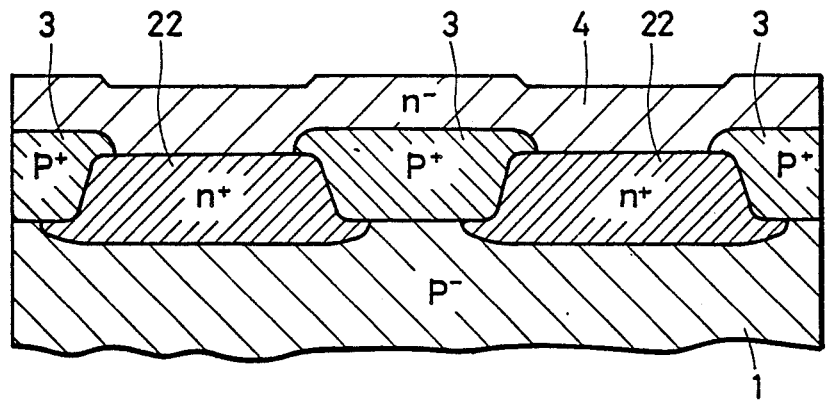
Figure 2F:
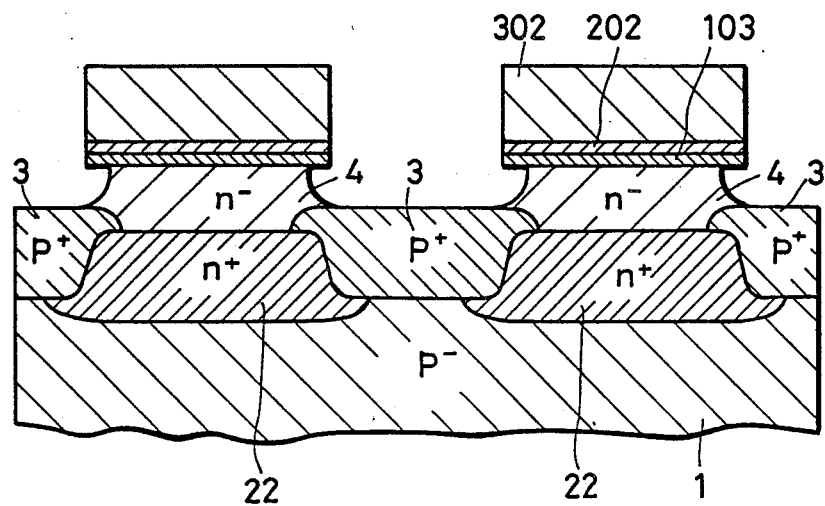
Figure 2G:
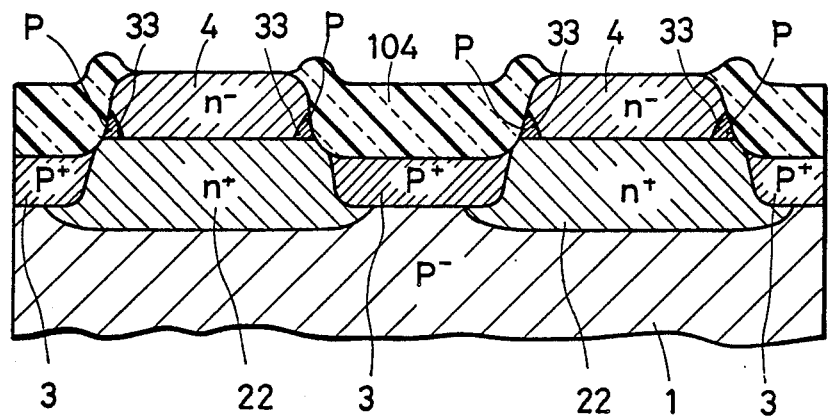

Finally the resist films 302 are removed and the nitride films 202 are utilized as masks to perform selective oxidation, thereby to form thick oxide films 104 in regions corresponding to isolation regions as shown in FIG. 1H. Similarly to the conventional case, the oxide films 104 are formed to be partially in contact with the n+-type buried layers 22 in bottom sides thereof. Since the regions of the p+-type buried layers 3 are narrower than those in the conventional case, no p-type regions 33 as shown in FIG. 2G are formed in the n−-type epitaxial layers 4 serving as element regions surrounded by the oxide films 104 and the n+-type buried layers 22. Further, since the isolation regions are narrower than those of the conventional case, the semiconductor device can be implemented with higher density of integration.

With respect to the aforementioned embodiment, FIG. 1A shows a first step, FIG. 1B shows second and third steps, FIG. 1C shows a fourth step, FIG. 1D shows fifth and sixth steps, FIG. 1E shows a seventh step, FIG. 1F shows an eighth step, FIG. 1G shows ninth and tenth steps and FIG. 1H shows an eleventh step.

The aforementioned description has been made on an embodiment for forming element regions and isolation regions through an oxide film isolation method, while the present invention is also applicable to isolation methods such as p-n junction isolation and selective oxide film isolation. Description is now made on such applications.

Figure 1I:
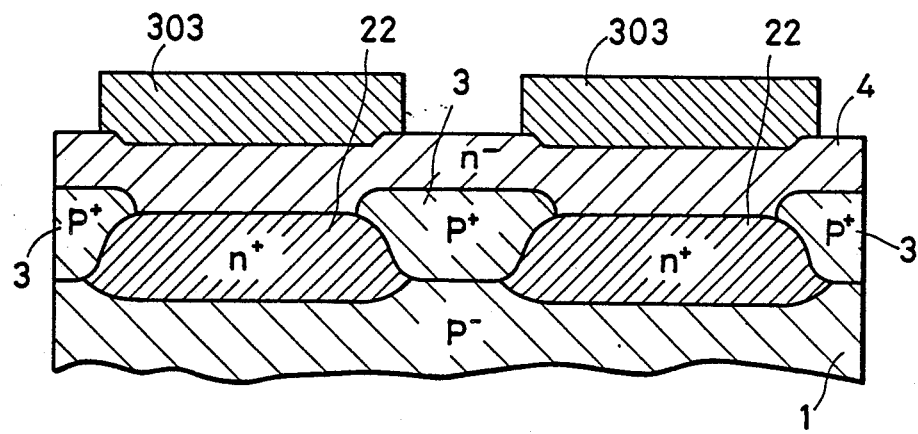
FIGS. 1I to 1K are sectional views showing principal steps of another embodiment of the present invention.

In case of application to p-n junction isolation, the steps as shown in FIG. 1A to 1F are identical to those of the aforementioned embodiment. Subsequent to the step as shown in FIG. 1F, resist films 303 are formed in regions corresponding to element regions on n−-type epitaxial layer 4 as shown in FIG. 1I. Then the resist films 303 are utilized as masks to introduce p-type impurity such as boron into regions corresponding to isolation regions on the n−-type epitaxial layer 4 through ion implantation or the like.

Figure 1J:
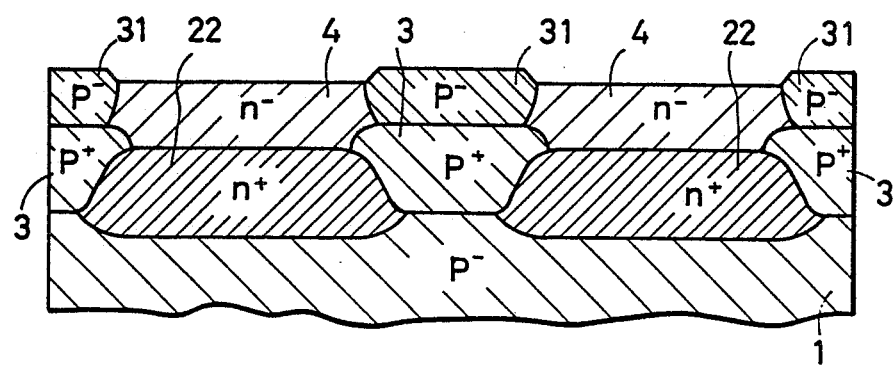

The resist films 303 are removed and the aforementioned p-type impurity is thermally diffused through heat treatment, to form p−-type diffusion layers 31. Thus, as shown in FIG. 1J, n-type element regions of the n−type epitaxial layers 4 are surrounded by p-type isolation regions of the p−-type diffusion layers 31 and p+-type buried layers 3, thereby to provide p-n junction isolation. Also in this method, the semiconductor device can be implemented with higher density of integration since the isolation regions are reduced in width while no p-type regions 33 as shown in FIG. 2G with reference to the conventional case are formed in the n−-type epitaxial layers 4 serving as element regions.

Figure 1K:
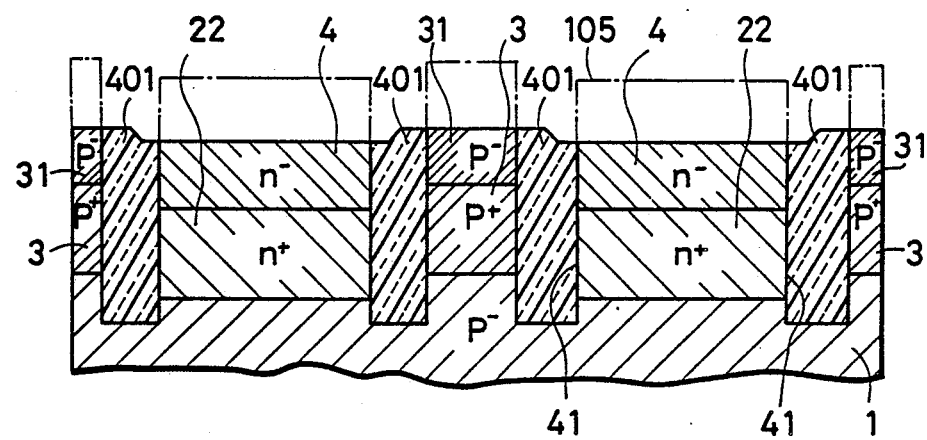

In the state as shown in FIG. 1J, further, groove-type isolation regions 401 of arbitrary width may be formed in boundary regions between the n-type regions and the p-type regions to completely isolate the n-type regions from the p-type regions, as shown in FIG. 1K. In ordr to form such groove-type isolation regions 401, thick oxide films 105 are formed in the state of FIG. 1J while avoiding the boundary regions between the n-type regions and the p-type regions, as shown in phantom lines in FIG. 1K. The oxide films 105 are utilized as masks to etch the semiconductor substrate 1 through dry etching, thereby to form grooves 41 along the boundary regions between the p-type regions and the n-type regions. The inner peripheral surfaces of the grooves 41 are thermally oxidized and insulation layers such as polysilicon films or oxide films are buried in the grooves 41, to form the groove-type isolation regions 401. When such groove-type isolation regions 401 are formed, it is possible to make the p-type regions also serve as element regions.

FIG. 1I shows a thirteenth step and FIG. 1J shows a fourteenth step, while FIG. 1K shows a fifteenth step.

Figure 1L:
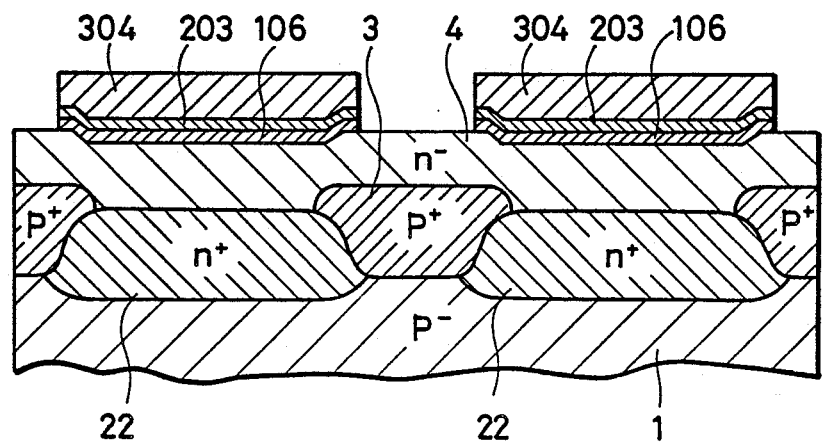
FIGS. 1L to 1N are sectional views showing principal steps of still another embodiment of the present invention.

Description is now made on the case of applying the present invention to selective oxide film isolation. Also in this case, the steps as shown in FIGS. 1A to 1F are performed similarly to the above. In the state as shown in FIG. 1F, three-layer films of oxide films 106, nitride films 203 and resist films 304 are formed in regions corresponding to element regions on n−-type epitaxial layer 4, as shown in FIG. 1L. The three-layer films are utilized as masks to introduce p-type impurity such as boron into regions corresponding to isolation regions of the n−-type epitaxial layer 4.

Figure 1M:
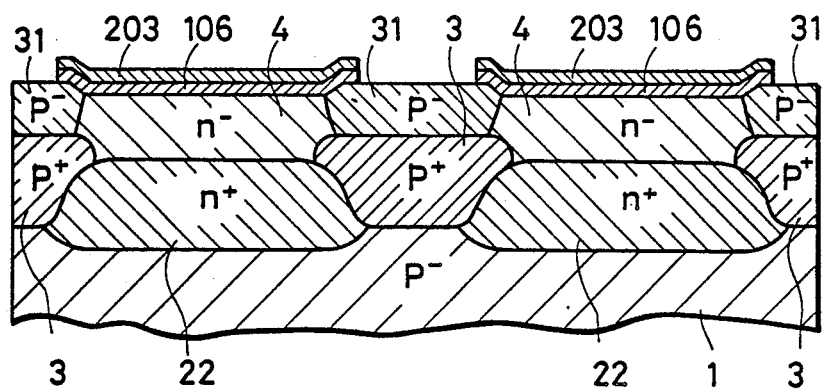

The resist films 304 are removed and the p-type impurity introduced into the regions corresponding to the isolation regions of the n−-type epitaxial layer 4 is diffused through heat treatment, to form p−-type diffusion layers 31 whose lower portions are connected with p+-type buried layers 3 as shown in FIG. 1M.

Figure 1N:
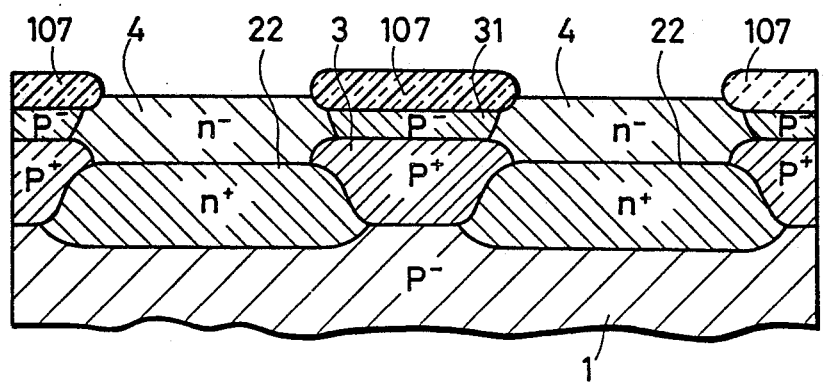

Thereafter selective oxidation is performed by utilizing the nitride films 203 as masks, to form oxide films 107 of arbitrary thickness on the surfaces of the p−-type diffusion layers 31 as shown in FIG. 1N. Finally, the oxide films 106 and the nitride films 203 are removed to form selective oxide film isolation regions.

Also in this method, the semiconductor device can be implemented with higher density of integration since the isolation regions are reduced in width, while no p-type regions 33 as shown in FIG. 2G with reference to the conventional case are formed in the n−-type epitaxial layers 4 serving as element regions.

FIG. 1L shows a sixteenth step and FIG. 1M shows a seventeenth step, while FIG. 1N shows an eighteenth step.

The present invention is also applicable to the case of reversing p-type and n-type polarities in the manufacturing steps as shown in FIGS. 1A to 1N, to attain an effect similar to the above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device having adjacent ones of element regions isolated by isolation regions, said method comprising:

a first step of successively stacking a first oxide film and a first nitride film on a first conductivity type semiconductor substrate of low impurity concentration;

a second step of removing a plurality of portions of a two-layer film formed by said first oxide film and said first nitride film through etching to form first regions in which two-layer films are left and second regions surrounded by said first regions;

a third step of introducing second conductivity type impurity into said second regions of said semiconductor substrate by utilizing said two-layer films of said first regions as masks;

a fourth step of performing side etching of side walls of said first oxide films by utilizing said first nitride films as masks to retract edges of said first oxide films to prescribed positions in said first regions;

a fifth step of performing selective oxidation by utilizing said first nitride films as masks to form second oxide films being larger in thickness than said first, oxide films on said second regions of said semiconductor substrate and on regions exposed in said fourth step within said first regions of said semiconductor substrate;

a sixth step of diffusing said second conductivity type impurity introduced into said second regions of said semiconductor substrate in said third step by heat treatment to form second conductivity type buried layers of high impurity concentration;

a seventh step of introducing, after removing said first nitride films, first conductivity type impurity into only regions having surfaces covered by said first oxide films within said first regions of said semiconductor substrate through said first oxide films by utilizing said second oxide films as masks and further performing heat treatment to form first conductivity type buried layers of high impurity concentration in regions between adjacent ones of said second conductivitiy type buried layers; and an eighth step of removing said first oxide films and said second oxide films and forming a second conductivity type epitaxial layer on said semiconductor substrate;

a ninth step of forming three-layer films of fifth oxide films, third nitride films and third resist films in regions corresponding to element regions on said epitaxial layer, subsequent to said eighth step, to introduce first conductivity type impurity into regions corresponding to isolation regions of said epitaxial layer by utilizing said three-layer films as masks;

a tenth step of removing said third resist films and performing heat treatment to diffuse said first conductivity type impurity introduced into said regions corresponding to isolation regions of said epitaxial layer thereby to form second diffusion layers of first conductivity type whose lower portions are connected to said first conductivity type buried layers; and an eleventh step of performing selective oxidation by utilizing said third nitride films as masks to form sixth oxide films on said second diffusion layers of first conductivity type and removing said fifth oxide films and said third nitride films.

* * * * *